United States Patent [19]

Kubo et al.

[11] 4,114,097
[45] Sep. 12, 1978

[54] FREQUENCY SHIFT SIGNAL RECEIVER

[75] Inventors: Noriyoshi Kubo; Takeshi Katano; Yoshinobu Tatsuzawa, all of Yokohama; Tadatoshi Hagihira, Sagamihara; Masahiko Yamamoto, Tokyo; Hiromi Wasai, Kyoto, all of Japan

[73] Assignees: Nippon Telegraph and Telephone Public Corp., Tokyo; Matsushita Electric Industrial Co., Ltd., Kadoma, both of Japan

[21] Appl. No.: 626,098

[22] Filed: Oct. 28, 1975

[30] Foreign Application Priority Data

Oct. 29, 1974 [JP] Japan ................................ 49/125015

[51] Int. Cl.$^2$ ............................................... H04B 1/16
[52] U.S. Cl. ...................................... 325/320; 325/492
[58] Field of Search ............... 325/320, 348, 349, 479, 325/480, 492

[56] References Cited

U.S. PATENT DOCUMENTS

| | | | |
|---|---|---|---|
| 3,621,409 | 11/1971 | Segawa | 325/349 |
| 3,710,143 | 1/1973 | Bray | 325/492 |
| 3,769,593 | 10/1973 | Williams | 325/492 |
| 3,852,671 | 12/1974 | Risley | 325/492 |
| 3,919,646 | 11/1975 | Morgan | 325/492 |

*Primary Examiner*—Benedict V. Safourek
*Assistant Examiner*—Michael A. Masinick
*Attorney, Agent, or Firm*—Stevens, Davis, Miller & Mosher

[57] ABSTRACT

A frequency shift receiver for periodically receiving frequency shift (FS) signals while cyclically turning on and off a power supply for a preceding section of the receiver. An output from the discriminator is turned on and off in synchronism with the turning on and off of the power supply to prevent noise even when a frequency difference exists between the transmitter and receiver.

3 Claims, 7 Drawing Figures

FREQUENCY SHIFT SIGNAL RECEIVER

BACKGROUND OF THE INVENTION

The present invention relates to an FM receiver for receiving a frequency shift (FS) signal. In particular, it relates to an FS receiver in which noise, which may occur when the power supply to a preceding section of the receiver is turned on and off in synchronism with the period of the signal for the purpose of reducing power consumption, is eliminated.

DESCRIPTION OF THE PRIOR ART

A prior art FM receiver of the type having a power supply which is periodically turned on and off is shown in FIG. 1. The receiver comprises a transistor $Q_1$, for driving a frequency discriminator, tuning capacitors $C_1$, $C_2$ and a transformer $T_1$. The frequency discriminator including a resonator $X_1$, a capacitor $C_3$, diodes $D_1$, $D_2$ and resistors $R_1$, $R_2$, a low pass filter including a resistor $R_3$ and bypass capacitors $C_4$, $C_5$, a coupling capacitor $C_6$, D.C. clamping resistors $R_4$, $R_5$, and a switch $SW_1$ for cyclically actuating a prececing section of the receiver. Referring to FIG. 2, when a received input signal $a$ is discriminated, a discrimination output as shown by $b$ appears at point A in FIG. 1. When the resistances of resistors $R_4$ and $R_5$ are equal, an output $c$ which is superposed on a voltage V is produced, voltage V being one half of the supply voltage +B. The capacitor $C_6$ is inserted to assure proper reception of the signal even if the receiver is subject to frequency drift. That is, the time constant of the parallel resistance of the resistors $R_4$ and $R_5$ and the capacitor $C_6$ is made sufficiently large compared with the signal frequency so that even when frequency drift of the receiver occurs and causes the voltage at point A to be asymmetric with respect to the zero voltage of a discrimination characteristic curve X (in FIG. 2) the voltage at point B will become symmetrical in the vertical direction with respect to the voltage V after a certain time interval as shown in FIG. 3($b$). This time interval is determined by the time constant of a circuit including capacitor $C_6$, resistor $R_4$ and resistor $R_5$. When signal detection of a decoder circuit is carried out using the voltage V as a reference, the signal can be correctly detected in spite of the frequency drift, as seen from FIGS. 3($a$) and 3($b$).

The cyclic operation of the preceding section of the receiver by the switch $SW_1$ is now explained.

FIGS. 4($b$) and 4($c$) show the voltages at points A and B in FIG. 1 when the preceding section of the receiver is cyclically operated as shown in FIG. 4($a$) by the switch $SW_1$. Switch $SW_1$ may be any conventional switching transistor in which the emitter is connected to +B, the collector to the preceding section of the receiver and the base receives a driving input similar to the waveform shown in FIG. 4($a$). When there is no frequency drift, the voltage at point B swings symmetrically in the vertical direction with respect to the voltage V during the cyclic operation and the decoder circuit can correctly detect the signal. When a frequency drift exists, as shown in FIGS. 5($a$), ($b$), ($c$), the voltage at the point B is varied in accordance with the voltage at the point A and shifted to the lower voltage side by a voltage increment $\Delta V$. As a result the decoder circuit cannot correctly discriminate the signal. Thus, the prior art receiver includes the disadvantage described above in the presence of a frequency drift.

SUMMARY OF THE INVENTION

The present invention improves the prior art discriminator circuit by providing a further switching means to turn on and off the output of the discriminator in synchronism with the cyclic operation of the preceding section of the receiver such that the coded signal can be correctly received even when a frequency drift exists and any noise which may possibly exist can be eliminated.

The above and other objects, features and advantages of the present invention will become more apparent from the following detailed description of a preferred embodiment of the invention when taken in conjunction with the accompanying drawings.

DETAILED DESCRIPTION OF THE PREFERRED EMBODIMENT

Figure 1:
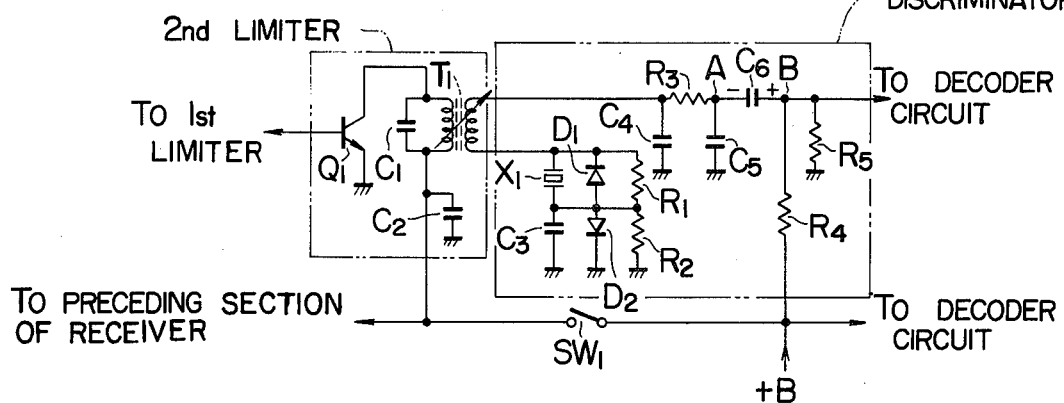
FIG. 1 is a circuit diagram of a prior art FS receiver.
Figure 2:
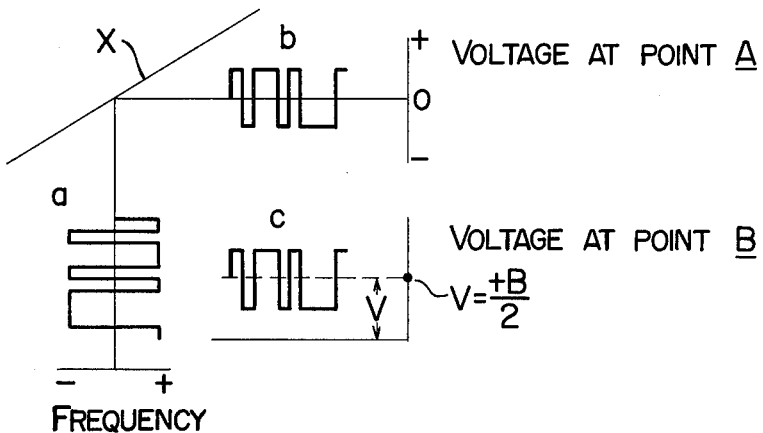
FIGS. 2, 3, 4 and 5 illustrate waveforms useful in explaining the operation thereof.
Figure 3:
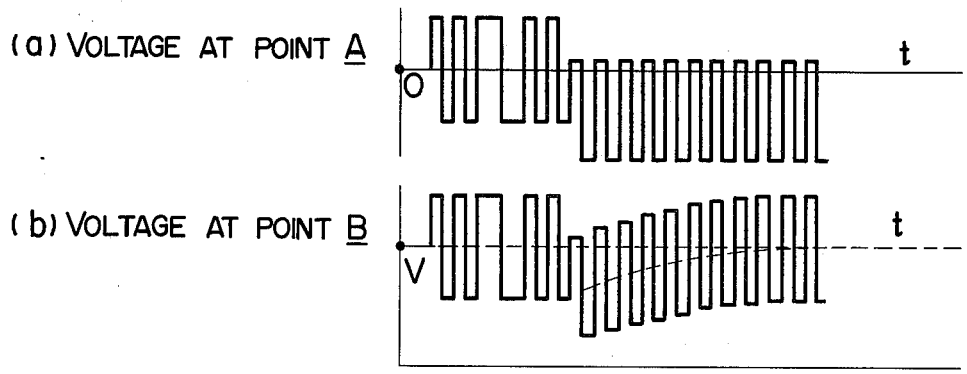
Figure 4:
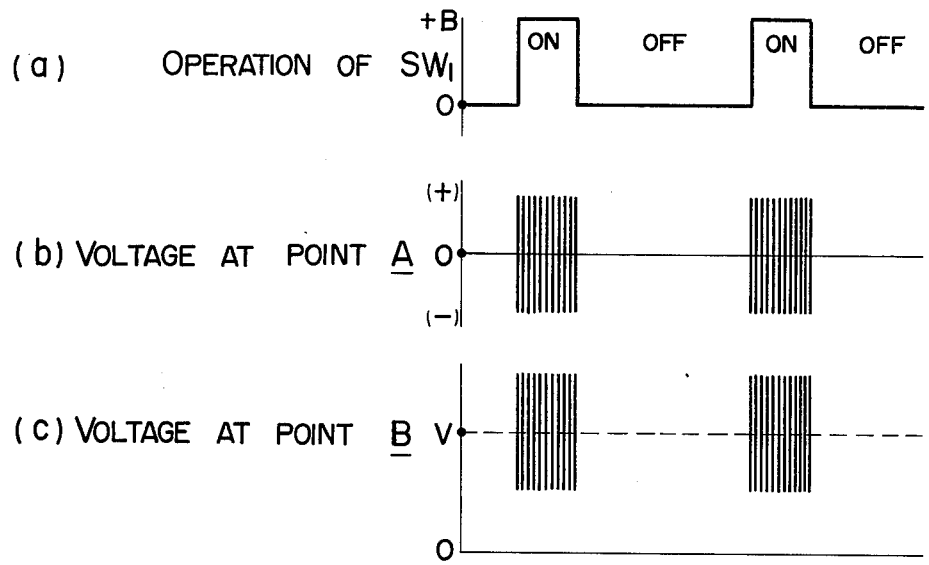
Figure 5:
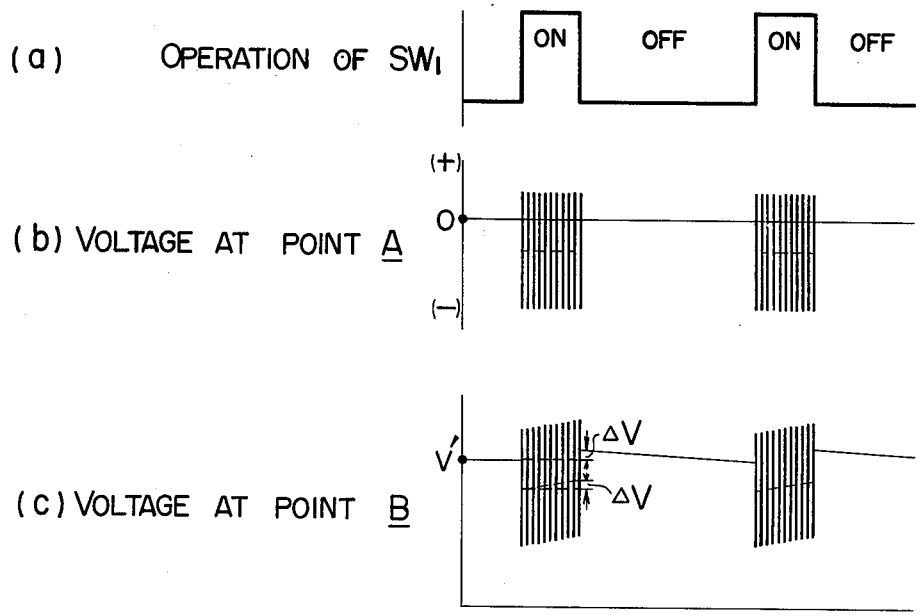

An embodiment of the present invention will now be explained with reference to FIG. 6. In the figure, $Q_1$, $C_1 - C_6$, $R_1 - R_5$ and $T_1$, $X_1$, $D_1$, $D_2$, $SW_1$ are the same as those in FIG. 1 and hence they are not explained here. $Q_2$ is a switching transistor having its emitter grounded and its collector connected to the junction point of the diode $D_2$ and the resistor $R_2$ and its base connected to one pole of the switch $SW_1$ through the resistor $R_6$. A bypass capacitor $C_7$ is connected to the collector of the transistor $Q_2$.

Figure 6:
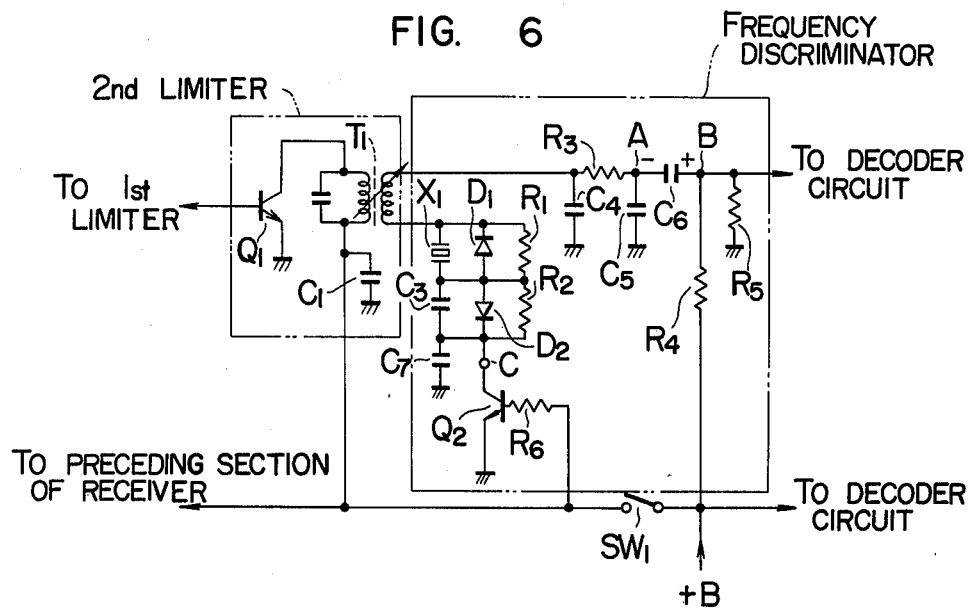
FIG. 6 is a circuit diagram of an FS receiver in accordance with an embodiment of the present invention.

The operation of the circuit arrangement shown in FIG. 6 is now described. The switch $SW_1$ which is the same as the one explaind with respect to the prior art FM receiver shown in FIG. 1 turns on and off the power supply to the preceding section of the receiver periodically at predetermined on and off periods, for example, as shown in FIG. 7($a$) in order to reduce power consumption of the receiver.

Since the base of transistor $Q_2$ is connected to one pole of the switch $SW_1$, power to the base of transistor $Q_2$ is also periodically turned on and off. As a result, point C of the frequency discriminator circuit is grounded through the transistor $Q_2$ only when switch $SW_1$ is turned on (the ON period shown in FIG. 7($a$)) and opened during the rest or OFF period.

Figure 7:
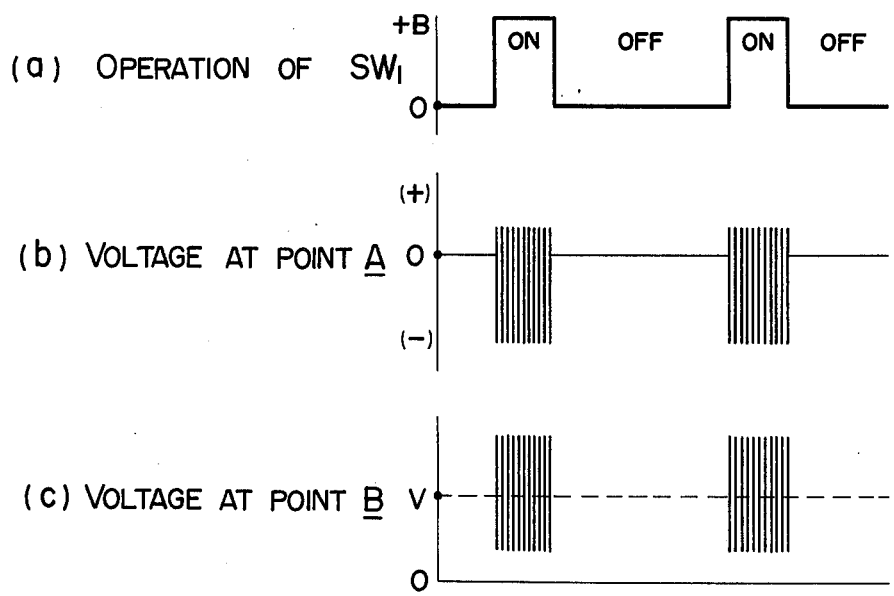
FIG. 7 illustrates waveforms useful in explaining the operation thereof.

Thus, in the present circuit, even when the input frequency drifts due to a frequency difference between the transmitter and receiver, the voltage at point A swings asymmetrically as shown in FIG. 7($b$), and hence the voltage at the point B swings symmetrically in the vertical direction with respect to the voltage V as shown in FIG. 7($c$). As a result, according to the present embodiment, the signal can be stably received at a decoder circuit of the receiver without noise even over a channel having a large frequency difference between the transmitter and the receiver while the receiving section is cyclically operated. Therefore, the present invention offers a significant advantage when it is applied to small, movable equipment.

It should be understood that the same effect is attained when transistor $Q_2$ is replaced by a different switching element such as a relay. Further, the same effect is attained when the switching element is inserted at the other output of the discriminator (for example, between $R_3$ and $C_6$) instead of the point illustrated in the above embodiment.

We claim:
1. A frequency shift receiver including a frequency discriminator for receiving a frequency shift signal comprising:
 first switching means connected between a power source and a preceding section of said receiver for periodically supplying power from said power source to said preceding section, and
 second switching means connected to said frequency discriminator for turning on and off an output of said frequency discriminator in synchronism with the turning on and off operation of said first switching means.

2. A frequency shift receiver according to claim 1, wherein said second switching means comprises a transistor having a collector connected to an output terminal of said frequency discriminator, an emitter connected to ground and a base connected to said first switching means to receive power periodically supplied from said power source.

3. A frequency shift receiver according to claim 2, which further comprises a capacitor connected between said output terminal of said frequency discriminator and ground.

* * * * *